(12) United States Patent
Sjoland

(10) Patent No.: US 10,135,404 B2
(45) Date of Patent: Nov. 20, 2018

(54) CALIBRATION OF PUSH-PULL AMPLIFIER TO A LOW SECOND ORDER DISTORTION

(71) Applicant: Telefonaktiebolaget LM Ericsson (publ), Stockholm (SE)

(72) Inventor: Henrik Sjoland, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 6 days.

(21) Appl. No.: 15/533,003

(22) PCT Filed: Dec. 4, 2014

(86) PCT No.: PCT/EP2014/076608
§ 371 (c)(1),
(2) Date: Jun. 2, 2017

(87) PCT Pub. No.: WO2016/086996
PCT Pub. Date: Jun. 9, 2016

(65) Prior Publication Data
US 2017/0324383 A1 Nov. 9, 2017

(51) Int. Cl.
*H03F 1/32* (2006.01)
*H03F 3/30* (2006.01)
(Continued)

(52) U.S. Cl.
CPC ........... *H03F 1/3217* (2013.01); *H03F 3/193* (2013.01); *H03F 3/3032* (2013.01); *H03F 3/265* (2013.01);
(Continued)

(58) Field of Classification Search
CPC ...... H03F 1/3217; H03F 3/193; H03F 3/3032; H03F 1/307; H03F 1/308; H03F 3/265;
(Continued)

(56) References Cited

U.S. PATENT DOCUMENTS

| | | | | |
|---|---|---|---|---|
| 3,921,089 A * | 11/1975 | Tsurushima | ............ | H03F 1/306 330/264 |
| 5,061,864 A * | 10/1991 | Rogers | ............ | H03K 3/037 326/17 |
| 5,221,910 A * | 6/1993 | Tournier | ............ | H03F 1/301 330/264 |
| 7,920,027 B2 * | 4/2011 | Keerti | ............ | H03F 1/0261 330/264 |
| 8,354,886 B2 * | 1/2013 | Brekelmans | ............ | H03F 1/308 330/267 |

(Continued)

FOREIGN PATENT DOCUMENTS

WO 2010018528 A1 2/2010

OTHER PUBLICATIONS

PCT International Search Report, dated Aug. 28, 2015, in connection with International Application No. PCT/EP2014/076608, all pages.

(Continued)

*Primary Examiner* — Khanh V Nguyen
(74) *Attorney, Agent, or Firm* — Leffler Intellectual Property Law, PLLC

(57) ABSTRACT

An integrated circuit comprises a first amplifier circuit with a push-pull amplifier configured to be calibrated to a low second order distortion. The integrated circuit further comprises a second amplifier circuit with at least one push-pull amplifier, wherein a size ratio between sizes of the transistors is adjustable by adjusting the size of at least one transistor device. The size ratio can be consecutively adjusted to a plurality of values, and for each value, a first output signal of a push-pull amplifier with an applied test signal and a second output signal of a push-pull amplifier without applied test signal, are determined. The size ratio for which a difference between the push-pull amplifier output signals is closest to zero is determined, and the push-pull (Continued)

amplifier of the first amplifier circuit is calibrated in dependence of the determined size ratio.

16 Claims, 7 Drawing Sheets

(51) Int. Cl.
    *H03F 3/193*     (2006.01)
    *H04B 1/16*     (2006.01)
    *H03F 3/26*     (2006.01)

(52) U.S. Cl.
    CPC .......... *H03F 3/3071* (2013.01); *H03F 3/3076* (2013.01); *H03F 2200/294* (2013.01); *H03F 2200/451* (2013.01); *H03F 2203/30003* (2013.01); *H04B 1/16* (2013.01)

(58) Field of Classification Search
    CPC ........ H03F 3/3001; H03F 3/3044; H03F 3/26; H03F 3/30
    USPC ................ 330/262, 263, 264, 265, 269, 271
    See application file for complete search history.

(56) References Cited

U.S. PATENT DOCUMENTS

| | | |
|---|---|---|
| 2008/0290943 A1 | 11/2008 | Schelmbauer |
| 2009/0002077 A1 | 1/2009 | Rohani et al. |
| 2009/0140812 A1 | 6/2009 | Deng et al. |
| 2009/0245541 A1 | 10/2009 | Wang |
| 2009/0251217 A1 | 10/2009 | Keerti |
| 2011/0133839 A1 | 6/2011 | Brekelmans |
| 2013/0094553 A1 | 4/2013 | Paek et al. |
| 2014/0155126 A1 | 6/2014 | Schelmbauer et al. |

OTHER PUBLICATIONS

PCT Written Opinion, dated Aug. 28, 2015, in connection with International Application No. PCT/EP2014/076608, all pages.

\* cited by examiner

CALIBRATION OF PUSH-PULL AMPLIFIER TO A LOW SECOND ORDER DISTORTION

TECHNICAL FIELD

The invention relates to an electronic integrated circuit comprising an amplifier circuit with at least one push-pull amplifier, an electronic apparatus comprising at least one such electronic integrated circuit, and a method of calibrating such an electronic integrated circuit.

BACKGROUND

Analog signal processing is used in many electronic systems, and typically the analog signal processing uses circuits for amplifying analog signals. An example of such electronic systems is a direct conversion receiver for radio frequency signals, which is the most popular receiver type in mobile phones. In such receivers, a radio frequency signal, or a down-converted version thereof, is typically amplified and/or filtered in the analog signal processing before it is converted to the digital domain for further processing. Thus, the relevant building blocks related to this are amplifiers, mixers, filters, and analog-to-digital converters.

The performance of such receivers heavily depends on the analog signal processing, and thus the relevant building blocks need to meet some strict requirements. Among other things, they must show a sufficiently high degree of linearity, so that distortion can be minimized. Even order nonlinearity is non-desired in most electronic systems, and it is especially harmful to the performance of direct conversion receivers. There are thus very stringent requirements throughout the analog signal path on even order linearity in such receivers. It is noted that the most relevant type of even order nonlinearity is second order nonlinearity, and therefore this term is often used instead.

Even order non-linearity is inherent in transistors. The most popular is to use MOS transistors, which are ideally square law devices with a pure second order non-linearity. Bipolar transistors have an exponential characteristic with strong non-linearity.

The even order non-linearity may be reduced or canceled by using differential circuits. The extent of cancelation depends on the matching between the halves of the circuit. However, in the design of cellular receivers, to save cost there is a trend to use single-ended inputs to mobile phone transceivers instead of differential inputs, which reduces the possibilities of using this type of cancellation.

Another recent trend is to reduce the amount of filtering between antenna and receiver, calling for increased linearity. Normally, an antenna filter, e.g. a SAW (surface acoustic wave) filter, has been used between the antenna and the analog signal processing. Removing the antenna filter means that very strong interference will be present at the input of the transceiver chip, which is single-ended. The even order non-linearity will then produce strong low frequency signals in the single-ended part of the receiver, i.e. the low noise amplifier, and if not blocked also strong low frequency common-mode signals in the differential part, i.e. the baseband. These signals will reduce the headroom for the desired signals and should thus be minimized. Even more important, with the antenna filter removed strong out-of-band signals can inter-modulate in the low noise amplifier, and if the intermodulation product is at the same frequency as the signal to receive, reception can be blocked. The intermodulation can occur due to both even and odd order non-linearities.

An amplifier type that can be used in these situations is the push-pull amplifier. A push-pull amplifier is usually implemented with a complementary pair of transistor devices of opposite conductivity type arranged in series between two supply voltages, typically a positive supply voltage and either a negative supply voltage or ground. One of the transistor devices is arranged to supply current to a load from the positive supply voltage, and the other one is arranged to sink current from the load to ground or the negative supply voltage. This amplifier type is interesting, especially because its symmetrical construction with the two transistor devices means that even order harmonics are in principle cancelled, so that even order non-linearity can be avoided or at least reduced. Further, the push-pull amplifier is simple in structure and has low power consumption and a relatively high gain.

If the two complementary transistor devices are designed to have the same analog characteristics, except for their opposite conductivity type, the even order non-linearity of the amplifier stage should be very low or zero. However, during production of the amplifier on an integrated circuit the two transistor devices are typically formed in different process steps, which means that in practice, due to production tolerances, it is difficult to achieve identical analog characteristics for the two complementary transistor devices, and therefore a certain amount of even order non-linearity will still be present in the amplifier stage. Thus, in practice, the push-pull amplifier seems not to be as beneficial to this application as it ideally should be, unless the problem with the production tolerances can be solved.

US 2011/0133839 describes an arrangement for calibrating the quiescent operating point of a push-pull amplifier. In a calibration mode, a control arrangement applies a test signal to the amplifier and measures an even order distortion of the amplifier. Based on the measured even order distortion the control arrangement adjusts a control signal, and a controllable biasing circuit is provided for changing the quiescent operating point of the amplifier as a function of the control signal, so that the even order distortion can be kept below a critical level. This is a complex and expensive solution because the measurement of the distortion directly at the amplifier output involves analog-to-digital conversion and performing a Fast Fourier Transform or similar function to determine the distortion components. Further, dedicated test tones have to be generated, and the normal operation of the amplifier is disturbed by the distortion measurement.

SUMMARY

Therefore, it is an object of embodiments of the invention to provide an integrated circuit having one or more push-pull amplifiers that can be calibrated to achieve a low second order distortion in a simple way and such that the second order distortion can be minimized even over process variations for the integrated circuit.

According to embodiments of the invention the object is achieved in an electronic integrated circuit comprising a first amplifier circuit with at least one push-pull amplifier having a complementary pair of transistor devices arranged in series between two supply voltages, wherein the first amplifier circuit is configured to be calibrated to achieve a low second order distortion. The object is achieved when the integrated circuit further comprises a second amplifier circuit with at least one push-pull amplifier having a complementary pair of transistor devices arranged in series between said supply voltages, wherein a size ratio between effective sizes of said complementary pair of transistor devices of the at least one push-pull amplifier of the second amplifier circuit is adjustable by adjusting the effective size of at least one of its transistor devices; and a test signal can be applied on an input terminal of said second amplifier circuit; and that the electronic integrated circuit is configured to consecutively adjust the size ratio of the at least one push-pull amplifier of the second amplifier circuit to a plurality of values, determine for each size ratio two output signals of said second amplifier circuit, of which a first output signal is a low pass filtered output signal of a push-pull amplifier with applied test signal, and a second output signal is an output signal of a push-pull amplifier without applied test signal; determine two adjacent size ratios for which a difference between said first and second push-pull amplifier output signals has opposite sign; select one of said two adjacent size ratios; and calibrate the at least one push-pull amplifier of the first amplifier circuit in dependence of said selected size ratio.

With the use of a second amplifier circuit in the form of a detection circuit having a push-pull amplifier with adjustable size ratio between its transistor devices and the possibility of determining the output of this push-pull amplifier with as well as without a test signal applied to its input, an optimal size ratio where the difference between the low frequency output with and without test signal, and thus also the second order distortion, is minimal (or close to minimal) can easily be found. The knowledge of this optimal size ratio can then be used for calibrating the push-pull amplifier of the first amplifier circuit, which is usually used in a signal path. In this way, second order distortion can be minimized even over process variations for the integrated circuit, since each integrated circuit is calibrated separately. The detection circuit is simple and has a low power consumption, and it can even be turned off after calibration, so that it does not consume any more energy.

In one embodiment, the integrated circuit further comprises a comparator configured to compare said first and second push-pull amplifier output signals and to provide a comparator output signal indicative of a sign of the difference between said first and second push-pull amplifier output signals; and the integrated circuit is further configured to determine the two adjacent size ratios for which a difference between said first and second push-pull amplifier output signals has opposite sign by determining a change in said comparator output signal. This use of a comparator to compare the two amplifier outputs is a simple way of detecting the optimal size ratio.

The second amplifier circuit may comprise two push-pull amplifiers of which a first push-pull amplifier has an input connected to the input terminal of said second amplifier circuit on which a test signal can be applied, and a second push-pull amplifier has an input connected to the output of the first push-pull amplifier. The size ratios of the first and second push-pull amplifiers are then arranged to be adjusted to identical values; and the two output signals to be determined are the output signals of the first and second push-pull amplifiers. This is a simple implementation that allows the two output signals to be determined simultaneously. It is noted that in practice, it can be difficult to obtain exactly identical values due to manufacturing inaccuracies. Thus, in this context, identical means identical within manufacturing tolerances rather than exactly identical.

In that case, the second amplifier circuit may further be configured to replace the complementary pair of transistor devices of the first push-pull amplifier with those of the second push-pull amplifier and vice versa. In this way random offset in the amplifiers due to device mismatch can be mitigated.

In one embodiment, the complementary pair of transistor devices of the push-pull amplifiers of the first and second amplifier circuits are n-type and p-type field effect transistor devices, respectively.

In another embodiment, each transistor device having an adjustable effective size can be implemented as a bank of transistors, wherein a selectable number of individual transistors can be coupled in parallel by means of controllable switches. In that case, said controllable switches are implemented as field effect transistors.

In a further embodiment, the electronic integrated circuit is configured to apply said test signal as a continuous wave signal from a local oscillator circuit arranged on the electronic integrated circuit. This is a simple solution, since the local oscillator circuit is already present on the integrated circuit.

In a further embodiment, a size ratio of the at least one push-pull amplifier of the first amplifier circuit is adjustable in the same way as for the at least one push-pull amplifier of the second amplifier circuit, and wherein the first amplifier circuit is calibrated by adjusting the size ratio of the at least one push-pull amplifier of the first amplifier circuit to said selected size ratio. When the size ratio of the push-pull amplifier of the first amplifier circuit, i.e. the signal path amplifier circuit, is also adjustable, the determined size ratio can be used directly by this amplifier.

An electronic apparatus may comprise at least one electronic integrated circuit as described above. In this way the apparatus benefits from the described advantages of the electronic integrated circuit. The electronic apparatus may be a wireless communications device comprising a direct conversion receiver or a low intermediate frequency receiver for radio frequency signals. In one embodiment, the wireless communications device may be a base station for a wireless communications system. In another embodiment, the wireless communications device is a mobile phone for use in a wireless communications system.

As mentioned, the invention further relates to a method of calibrating a first amplifier circuit of an electronic integrated circuit to achieve a low second order distortion, wherein the first amplifier circuit comprises at least one push-pull amplifier having a complementary pair of transistor devices arranged in series between two supply voltages, wherein the electronic integrated circuit further comprises a second amplifier circuit with at least one push-pull amplifier having a complementary pair of transistor devices arranged in series between said supply voltages, and wherein a size ratio between effective sizes of said complementary pair of transistor devices of the at least one push-pull amplifier of the second amplifier circuit is adjustable by adjusting the effective size of at least one of its transistor devices. The method comprises the steps of consecutively adjusting the size ratio of the at least one push-pull amplifier of the second amplifier circuit to a plurality of values; determining, for each size ratio, two output signals of said second amplifier circuit, of which a first output signal is a low pass filtered output signal of a push-pull amplifier with a test signal applied to an input terminal of said second amplifier circuit, and a second output signal is an output signal of a push-pull amplifier without applied test signal; determining two adjacent size ratios for which a difference between said first and second push-pull amplifier output signals has opposite sign; selecting one of said adjacent size ratios; and calibrating the at least one push-pull amplifier of the first amplifier circuit in dependence of said selected size ratio.

With the use of a second amplifier circuit in the form of a detection circuit having a push-pull amplifier with adjustable size ratio between its transistor devices and the possibility of determining the low frequency output of this push-pull amplifier with as well as without a test signal applied to its input, an optimal size ratio where the difference between the low frequency output with and without test signal, and thus also the second order distortion, is minimal, or close to minimal, can easily be found. The knowledge of this optimal size ratio can then be used for calibrating the push-pull amplifier of the first amplifier circuit, which is usually used in a signal path. In this way, second order distortion can be minimized even over process variations for the integrated circuit, since each integrated circuit is calibrated separately. The detection circuit is simple and has a low power consumption, and it can even be turned off after calibration, so that it does not consume any more energy.

In one embodiment, the method comprises the step of applying said test signal as a continuous wave signal from a local oscillator circuit arranged on the electronic integrated circuit. This is a simple solution, since the local oscillator circuit is already present on the integrated circuit.

In another embodiment, a size ratio of the at least one push-pull amplifier of the first amplifier circuit is adjustable in the same way as for the at least one push-pull amplifier of the second amplifier circuit, and the method comprises the step of calibrating the first amplifier circuit by adjusting the size ratio of the at least one push-pull amplifier of the first amplifier circuit to said selected size ratio. When the size ratio of the push-pull amplifier of the first amplifier circuit, i.e. the signal path amplifier circuit, is also adjustable, the determined size ratio can be used directly by this amplifier.

BRIEF DESCRIPTION OF THE DRAWINGS

Embodiments of the invention will now be described more fully below with reference to the drawings, in which.

DETAILED DESCRIPTION

Figure 1:
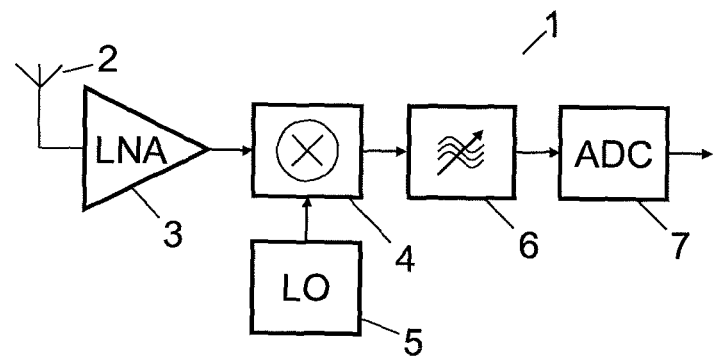
FIG. 1 shows a block diagram of an analog signal processing part of a direct conversion receiver.

FIG. 1 shows a block diagram of an example of the analog domain part of a direct conversion receiver 1, which can be used as receiver for radio frequency signals in a wireless communications system. In the receiver 1, radio frequency signals are received at an antenna 2, and from the antenna 2 the radio frequency signal is connected to a low noise amplifier 3 and fed to a mixer 4, in which it is down converted to a baseband input signal. These signals can be either differential signals or single ended signals, but as mentioned above, there is a trend to prefer single ended signals in order to save cost. The mixer 4 is clocked by a clock signal from a local clock generator 5 that may generate the clock signal, e.g. by a phase locked loop (PLL) locked to a reference clock signal. The baseband input signal is then low pass filtered in a low pass filter 6 with variable bandwidth, before it is converted to the digital domain in an analog-to-digital converter 7 for further processing.

In the analog signal path from the antenna 2 to the analog-to-digital converter 7 of a receiver as the one shown in FIG. 1, the signal is typically processed by one or more amplifier stages in each one of the low noise amplifier 3, the mixer 4, the low pass filter 6 and the analog-to-digital converter 7. The performance of the receiver heavily depends on the analog signal processing, and thus these building blocks need to meet some strict requirements. Among other things, they must show a sufficiently high degree of linearity, so that distortion can be minimized. Even order nonlinearity is non-desired in most electronic systems, and it is especially harmful to the performance of direct conversion receivers. There are thus very stringent requirements throughout the analog signal path on even order linearity in such receivers.

Figure 2:
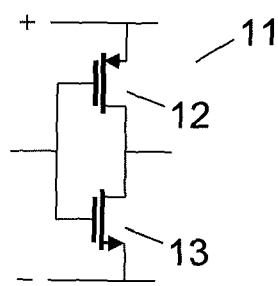
FIG. 2 shows an example of a push-pull amplifier stage that can be used in the direct conversion receiver of FIG. 1.

An example of an amplifier stage that is suitable for this application is a push-pull amplifier 11 shown in FIG. 2. Thus the push-pull amplifier 11 can be used as an amplifier stage in any one of the low noise amplifier 3, the mixer 4, the low pass filter 6 and the analog-to-digital converter 7. The push-pull amplifier 11 is implemented with a pull-up transistor device 12 in the form of a p-type MOSFET (Metal-Oxide Semiconductor Field Effect Transistor) and a pull-down transistor device 13 in the form of an n-type MOSFET arranged in series between a positive and a negative supply voltage. One of the supply voltages, typically the negative one, may also be connected to ground. The p-type MOSFET may also be denoted as PMOS and the n-type MOSFET as NMOS. However, it is noted that a push-pull amplifier may also be implemented with two complementary bipolar transistors.

Because of its symmetrical construction, the push-pull amplifier 11 exhibits a low even order non-linearity. If the two complementary transistor devices 12, 13 are designed to have the same analog characteristics, except for their opposite conductivity type, the even order non-linearity of the amplifier stage should be very low or zero. However, during production of the amplifier on an integrated circuit the two MOSFET devices are typically formed in different process steps, which means that in practice, due to production tolerances, it is difficult to achieve identical analog characteristics for the p-type and n-type transistor devices, and therefore a certain amount of even order non-linearity will still be present in the amplifier stage. Normally, the effect of the production tolerances is that the effective size of the transistor devices will vary around its nominal value. For MOSFET devices, the variation can typically be represented by changes in equivalent channel width. The variation will be substantially the same for all transistor devices of the same type on a given integrated circuit or chip, since they are all made in the same production process. Transistor devices of the same type designed to have different sizes will vary in the same proportion. It is noted that for a PMOS transistor and an NMOS transistor to have the same analog characteristics, except for their opposite conductivity type, the PMOS transistor will normally need a wider channel that the NMOS transistor.

Thus, in practice, the push-pull amplifier seems not to be as beneficial to this application as it ideally should be, unless the problem with the production tolerances can be solved.

A solution to this problem is described below. The solution is based on the use of a detection circuit that is integrated on the same chip as the amplifier 11, i.e. on the same chip as any one of the low noise amplifier 3, the mixer 4, the low pass filter 6 and the analog-to-digital converter 7.

Figure 3:
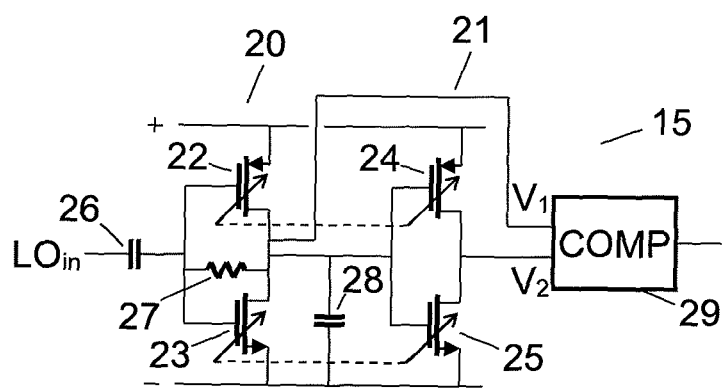
FIG. 3 shows an embodiment of a detection circuit for determining a size ratio between transistor sizes in a push-pull amplifier that results in a minimized second order distortion in the push-pull amplifier.

One embodiment of such a detection circuit is illustrated as the detection circuit 15 in FIG. 3. The detection circuit 15 is used to find the size ratio between the pull-up (PMOS) and pull-down (NMOS) devices that minimizes the even order distortion in a push-pull amplifier. When this size ratio has been found, the information can be used for calibrating the push-pull amplifiers in the low noise amplifier 3, the mixer 4, the low pass filter 6 and the analog-to-digital converter 7 to minimal even order distortion. The circuit is composed of two push-pull amplifiers 20, 21 and a comparator 29.

The first push-pull amplifier 20 comprising a PMOS pull-up transistor 22 and an NMOS pull-down transistor 23 is subjected to a test signal in the form of a strong continuous wave input signal, e.g. a local oscillator signal available in the receiver. This first amplifier 20 is AC-coupled by a capacitor 26 at the input, and it is self-biased by a feedback resistor 27. Even order intermodulation present in this amplifier will manifest itself as a DC-shift at the output, compared to having zero input signal. At the output of the amplifier there is a capacitor 28 to ground to suppress high frequency signals, as we are only interested in the DC-value of the output.

The output $V_1$ of the first amplifier 20 is fed to the input of the second amplifier 21 comprising a PMOS pull-up transistor 24 and an NMOS pull-down transistor 25. Amplifier 21 is identical to the first amplifier 20 except that it does not have self-biasing through resistive feedback or AC-coupling capacitance. As the second amplifier 21 does not have any strong signal present at its input, it will not have any DC-shift at its output $V_2$. It thus serves as a reference, comparing the output of the first amplifier 20 to the value with no input signal, and amplifying it.

A comparator 29 with differential input can then be placed between the outputs $V_1$ and $V_2$ of the two amplifiers 20, 21 to investigate the sign of the second order nonlinearity coefficient. The sign of the output of the comparator 29 indicates which one of the outputs $V_1$ and $V_2$ of the two amplifiers 20, 21 has the highest value.

The size of either one of the NMOS devices 23, 25 and the PMOS devices 22, 24 or both the NMOS devices and the PMOS devices in the amplifiers is made programmable, which is illustrated with the arrows through the devices. The device sizes of the NMOS devices 23, 25 or the PMOS devices 22, 24 in the two amplifiers are changed in tandem as illustrated with the dashed lines connecting the arrows through the respective devices. The size ratio, i.e. the ratio between the size of the PMOS devices 22, 24 and the NMOS devices 23, 25, may be swept either from smallest to highest, or vice versa, and for each size ratio the sign of the comparator output indicates which one of the outputs $V_1$ and $V_2$ of the two amplifiers 20, 21 has the highest value for this size ratio. When the sign changes the transition point is found, which represents the transistor size ratio where the even order distortion is minimized, because for this size ratio the push-pull amplifier low-frequency output is approximately the same with and without a strong signal applied at the push-pull input. It is also possible to use other search methods, like interval halving.

In FIG. 3, the size of the PMOS devices 22, 24 as well as the size of the NMOS devices 23, 25 are shown as programmable. However as mentioned, it is noted that in order to change the size ratio it is sufficient that either the size of the PMOS devices 22, 24 or the size of the NMOS devices 23, 25 is programmable.

Further, it is noted that the size of the transistors in the first push-pull amplifier 20 does not need to be the same as the size of the transistors in the second push-pull amplifier 21, but the size ratio between the PMOS and NMOS devices in the two amplifiers need to be the same. For example, the transistors of the push-pull amplifier 20 can be sized to be a factor K larger than the push-pull amplifier 21 (or vice versa). That means that the NMOS transistor of the push-pull amplifier 20 is a factor K wider than the NMOS transistor of the push-pull amplifier 21, and the PMOS transistor of the push-pull amplifier 20 is a factor K wider than the PMOS transistor of the push-pull amplifier 21. Effectively, the first push-pull amplifier 20 can thus be seen as K copies of the second push-pull amplifier 21 connected in parallel. The important thing is that the relation between the size of the PMOS transistor and the size of the NMOS transistor are the same for both push pull amplifiers.

In FIG. 3, the outputs of the two push-pull amplifiers 20, 21 are compared by the comparator 29, which for each value of the programmable size ratio between the PMOS and NMOS transistors indicates which one of the two outputs has the highest value. However, other circuit types can be used instead of the comparator 29, e.g. a linear circuit producing an output that is indicative of the difference between the two amplifier outputs. In that case, the size ratio value giving the linear circuit output that is closest to zero can be selected as the size ratio where the even order distortion is minimized.

Figure 4:
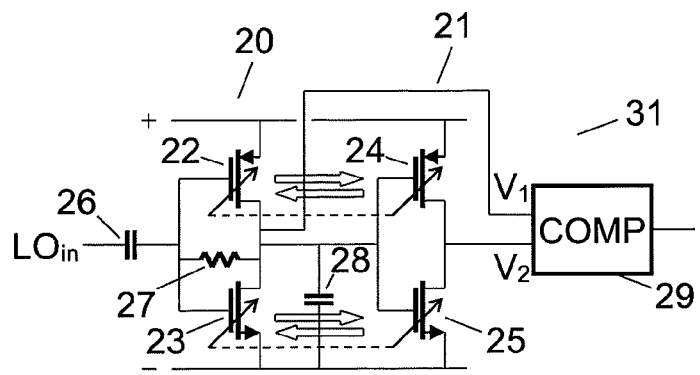
FIG. 4 shows another embodiment of a detection circuit for determining a size ratio between transistor sizes in a push-pull amplifier that results in a minimized second order distortion in the push-pull amplifier.

Random offset in the amplifiers due to device mismatch can affect the result. To mitigate this, switches could be implemented that effectively switch places of the two amplifiers, which is illustrated in the detection circuit 31 shown in FIG. 4. Arrows indicate that the transistors can switch places by means of a number of not shown switches, so that the transistors 24, 25 will instead be a part of the first push-pull amplifier 20, while the transistors 22, 23 will instead be a part of the second push-pull amplifier 21. The search for optimum transistor size ratio should then be performed twice, once for each amplifier position, and the result averaged.

An alternative that can also be combined with the above method to mitigate mismatch is to increase the programmable transistors by more switched elements, forming multiple ways to create a certain nominal transistor width using different device combinations. The result could then be evaluated after K searches with different combinations.

Figure 5:
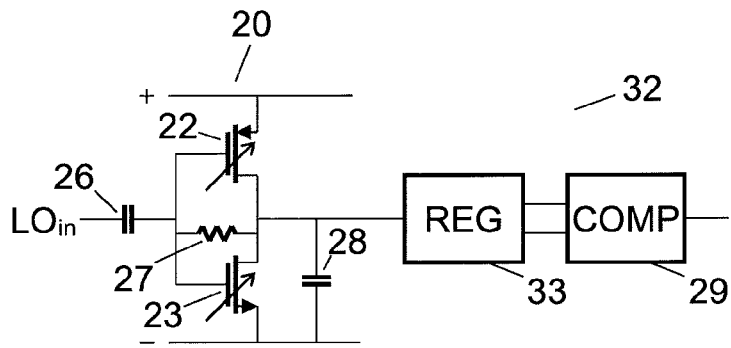
FIG. 5 shows still another embodiment of a detection circuit for determining a size ratio between transistor sizes in a push-pull amplifier that results in a minimized second order distortion in the push-pull amplifier.

Another embodiment of a detection circuit is illustrated as the detection circuit 32 shown in FIG. 5. Compared to the detection circuit 15 in FIG. 3, the detection circuit 32 only uses one push-pull amplifier 20 corresponding to the first push-pull amplifier 20 in FIG. 3. Instead, the input signal applied to the amplifier, e.g. a strong continuous wave signal arrived from a local oscillator in the receiver, can be switched on and off. When the input signal is on, even order nonlinearity present in the amplifier 20 will, as in FIG. 3, manifest itself as a DC shift at its output. The value of this output signal can then be stored in a register 33. When the input signal is off, the amplifier 20 will, because there is no signal present at its input, not have any DC shift at the output. Also this value is fed to the register 33, and the comparator 29 can now compare the two signals from the register 33 in the same way as it compared the two amplifier outputs in FIG. 3. Again, the sign of the output of the comparator 29 indicates which one of the outputs has the highest value, i.e. the sign of the second order nonlinearity coefficient.

Figure 6:
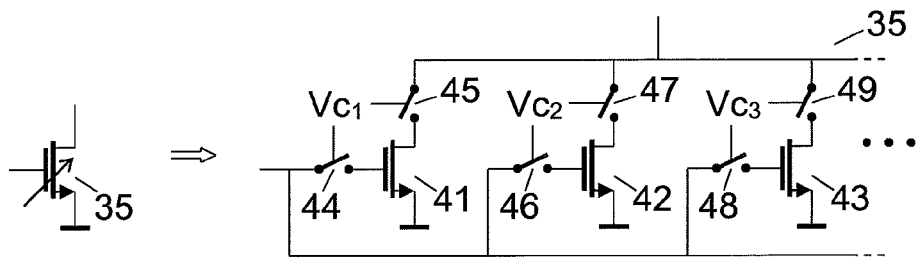
FIG. 6 shows how a MOSFET transistor with programmable size can be implemented as a bank of fixed size transistors.

FIG. 6 illustrates how a MOSFET transistor with programmable size can be implemented as a bank of fixed size transistors that can be switched in to the circuits at either its gate or drain terminal, or both. At the left side of FIG. 6, an NMOS transistor 35 with programmable size is shown, as it can be seen at the arrow through the device. At the right side of the figure, the NMOS transistor 35 is shown implemented as a number of fixed size NMOS transistors 41, 42, 43 that can be connected in parallel by means of switches. Switches 44, 46, 48 can connect the input signal to the gate terminals of the transistors, while switches 45, 47, 49 can connect the drain terminals of transistors to the drain terminal of the transistor 35. Thus the effective size of the NMOS transistor 35 can be adjusted by connecting a number of the transistors 41, 42, 43 in parallel. The weighting of the transistor sizes of the transistors 41, 42, 43 can be different, for instance using binary weighting, equal sizes, or a larger device combined with small ones for fine tuning. PMOS transistors with programmable size can be implemented in a similar way.

Figure 7:
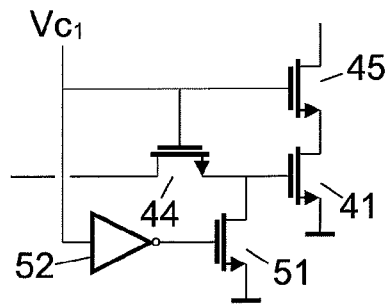
FIG. 7 shows how switches used in FIG. 6 can be implemented with MOSFET transistors.

The switches 44, 45, 46, 47, 48, 49 can also be implemented with MOSFET transistors, which is illustrated in FIG. 7 for the NMOS transistor 41. The switch 44 for connecting the input signal to the gate terminal of transistor 41 is implemented as an NMOS transistor 44 in combination with another NMOS transistor 51 driven by an inverter 52 arranged to connect the gate terminal to ground when the input signal is disconnected. The switching transistors 44, 51 are controlled by a control signal $Vc_1$, which is activated by a controller in dependence of the desired size of transistor 35. The switch 45 for connecting the drain terminal of transistor 41 to the drain terminal of the transistor 35 is implemented as an NMOS transistor 45 that is also controlled by the control signal $Vc_1$.

As described above, the detection circuits 15, 31, 32 are configured to determine the size ratio between the PMOS and NMOS transistors in a push-pull amplifier on an integrated circuit that results in a minimized even order nonlinearity. When this optimal size ratio has been found, the knowledge can be used for calibrating the push-pull amplifiers in the low noise amplifier 3, the mixer 4, the low pass filter 6 and/or the analog-to-digital converter 7 to minimal even order distortion, because these amplifiers are located on the same integrated circuit and thus have been manufactured in the same process steps, so that the optimal size ratio for the push-pull amplifiers of the detection circuit is also the optimal size ratio for the push-pull amplifiers in the signal path of the receiver.

In one embodiment, the push-pull amplifiers in the signal path of the receiver can be calibrated by using the knowledge of the optimal size ratio for that integrated circuit to calculate a control signal arranged to change the quiescent operating point of the push-pull amplifiers in the signal path, e.g. by applying a controllable offset current to an input of the push-pull amplifiers or by imposing a controllable biasing voltage in series with the PMOS transistor and/or NMOS transistor in the push-pull amplifiers.

Figure 8:
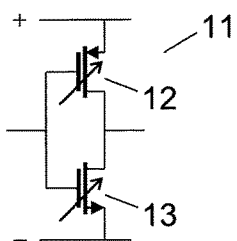
FIG. 8 shows the push-pull amplifier stage of FIG. 2 with programmable size ratio.

In another embodiment, the size of the PMOS transistors and/or the NMOS transistors of the push-pull amplifiers in the signal path is made programmable in the same way as in the detection circuit. This is illustrated in FIG. 8, which shows the push-pull amplifier 11 of FIG. 2 with the difference that the PMOS transistor 12 and the NMOS transistor 13 are now shown with arrows indicating that the effective size, i.e. the channel width, of the transistors is programmable. The size ratio for the push-pull amplifier 11, i.e. the ratio between the size of the PMOS transistor 12 and the size of the NMOS transistor 13, can then be set according to the optimal size ratio that was determined by the detection circuit 15, 31 or 32.

Figure 9:
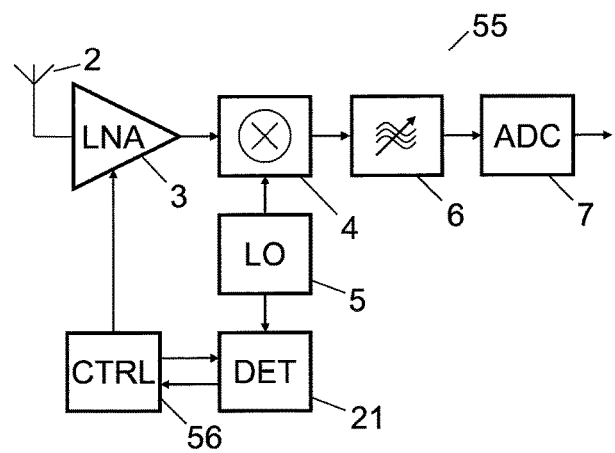
FIG. 9 shows a block diagram of an analog signal processing part of a direct conversion receiver in combination with a detection circuit.

FIG. 9 shows the analog domain part of a receiver 55, where this is implemented. The antenna 2, the low noise amplifier 3, the local clock generator 5, the mixer 4, the low pass filter 6 and the analog-to-digital converter 7 are the same components as in the receiver 1 in FIG. 1. The signal from the local clock generator 5 is now also applied to the input of a detection circuit 21 as the one shown in FIG. 3. Alternatively, the detection circuits 31 of FIG. 4 or 32 of FIG. 5 could be used as well. A control circuit 56 is configured to program the size ratio of the push-pull amplifiers of the detection circuit 21 to a number of different values as it has been described above, and for each selected size ratio the sign of the output of the comparator 29 is checked until the sign changes. Then the optimal size ratio is known, and the control circuit 56 can now program the size ratio of a push-pull amplifier 11 in e.g. the low noise amplifier 3 to the same size ratio. It is noted that the individual push-pull amplifiers in the low noise amplifier 3, the mixer 4, the low pass filter 6 and/or the analog-to-digital converter 7 have different absolute sizes of their transistors, but the control circuit 56 will adjust them to have the size ratio that was determined by the control circuit 56 and the detector circuit 21, independently of their actual size.

The calibration technique described above ensures even order distortion cancellation over process variation. Without this calibration the cancellation would only be effective under typical conditions, and the circuit would then not meet the linearity requirements in other process corners. Calibration is thus necessary to make the yield acceptable. The calibration is based on a distortion detection circuit, which is fed by a strong continuous wave signal from the local oscillators. The detection circuit comprises two push-pull amplifiers, and the corresponding DC-output voltage shift due to the second order nonlinearity of the continuous wave signal fed to one of the amplifiers is detected. The effective size of the devices in the detector, i.e. the pull-up device or the pull-down device (or possibly both), is then controlled until the DC-output voltage level shift becomes close to zero. The size ratio of the pull-up and pull down devices for low distortion operation is then known, and the effective device size of the amplifiers in the signal path can be set accordingly. The size ratio will depend on process corner and can thus not be a fixed value set at design time.

The detection circuit is simple and low power, and can even be turned off after calibration so it does not consume any more energy. By using the calibration, the push-pull amplifiers in the circuit will have very low even order distortion, even over process variation. The calibration of the amplifiers can be made very simple with low overhead in parasitics and chip area. Reducing the even order distortion products will provide more headroom for desired signals. It will also reduce the risk of signal reception being blocked by even order intermodulation products in single-ended input receivers without SAW-filters.

Figure 10:
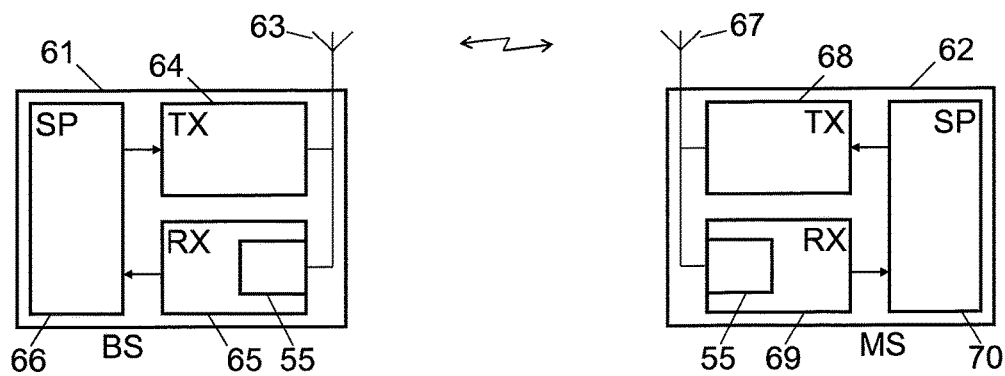
FIG. 10 shows a base station and a mobile station in which the circuit of FIG. 9 can be used.

FIG. 10 shows an example of a wireless communications system, in which the receiver circuit 55 of FIG. 9 can be used. Radio frequency signals are transmitted between two wireless communications devices, which are here exemplified by a base station 61 and a mobile station 62. In the base station 61, an antenna 63 is connected to a transmitter 64 and a receiver 65, which are both connected to a signal processing unit 66. As illustrated, the receiver 65 comprises the receiver circuit 55 with the detection circuit 21 and the analog signal processing in the low noise amplifier 3, the mixer 4, the low pass filter 6 and the analog-to-digital converter 7. Similarly, in the mobile station 62, an antenna 67 is connected to a transmitter 68 and a receiver 69, which are both connected to a signal processing unit 70. As illustrated, the receiver 69 comprises the receiver circuit 55 with the detection circuit 21 and the analog signal processing in the low noise amplifier 3, the mixer 4, the low pass filter 6 and the analog-to-digital converter 7.

To illustrate the effect of the solution described above, simulations have been performed in a simulation program. A detector circuit was designed according to the schematic in FIG. 3. The NMOS transistors were 10 um wide and 0.5 um long. The PMOS length was also 0.5 um, and the PMOS width was swept. The input signal was 300 mV at 1 GHz. The positive supply voltage was 1.2V and the negative supply voltage was 0V. The output voltages $V_1$ and $V_2$ of the two push-pull amplifiers 20, 21 of the detection circuit 15, i.e. the input voltages to the comparator 29, were determined as functions of the swept PMOS width.

As an example of a signal path amplifier, an amplifier with the same topology and transistor dimensions as the ones in the detector was also simulated, here loaded by 100 Ohms. This amplifier was subjected to a two-tone test to check its linearity. The tones injected at the input were at 1 GHz and 1.2 GHz, giving a second order product at 200 MHz. The input tone amplitudes were 200 mV each. The second order intermodulation was determined as a function of the swept PMOS width.

Figure 11:
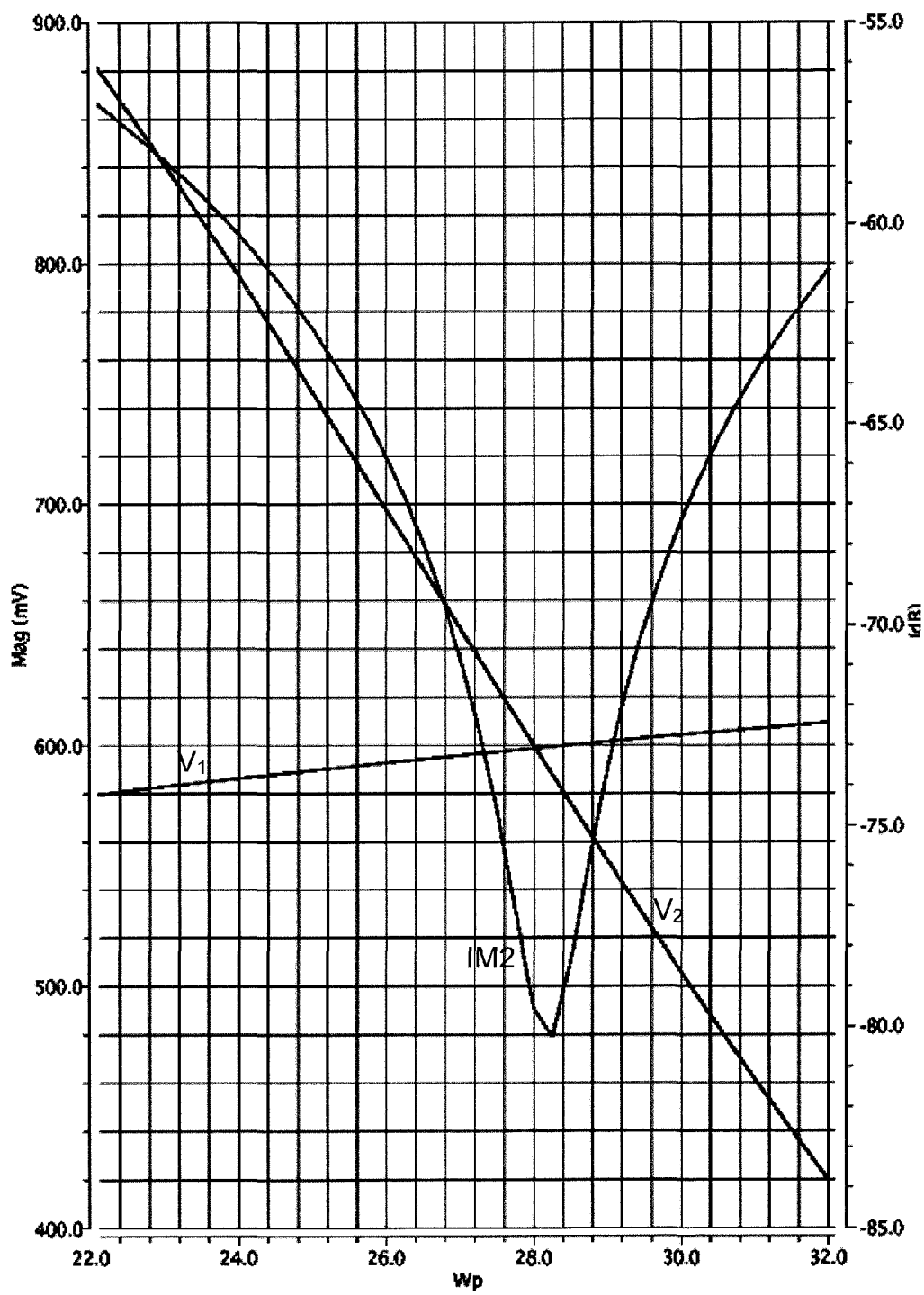
FIGS. 11, 12 and 13 show simulation results illustrating the effect of the circuit of FIG. 9.
Figure 12:
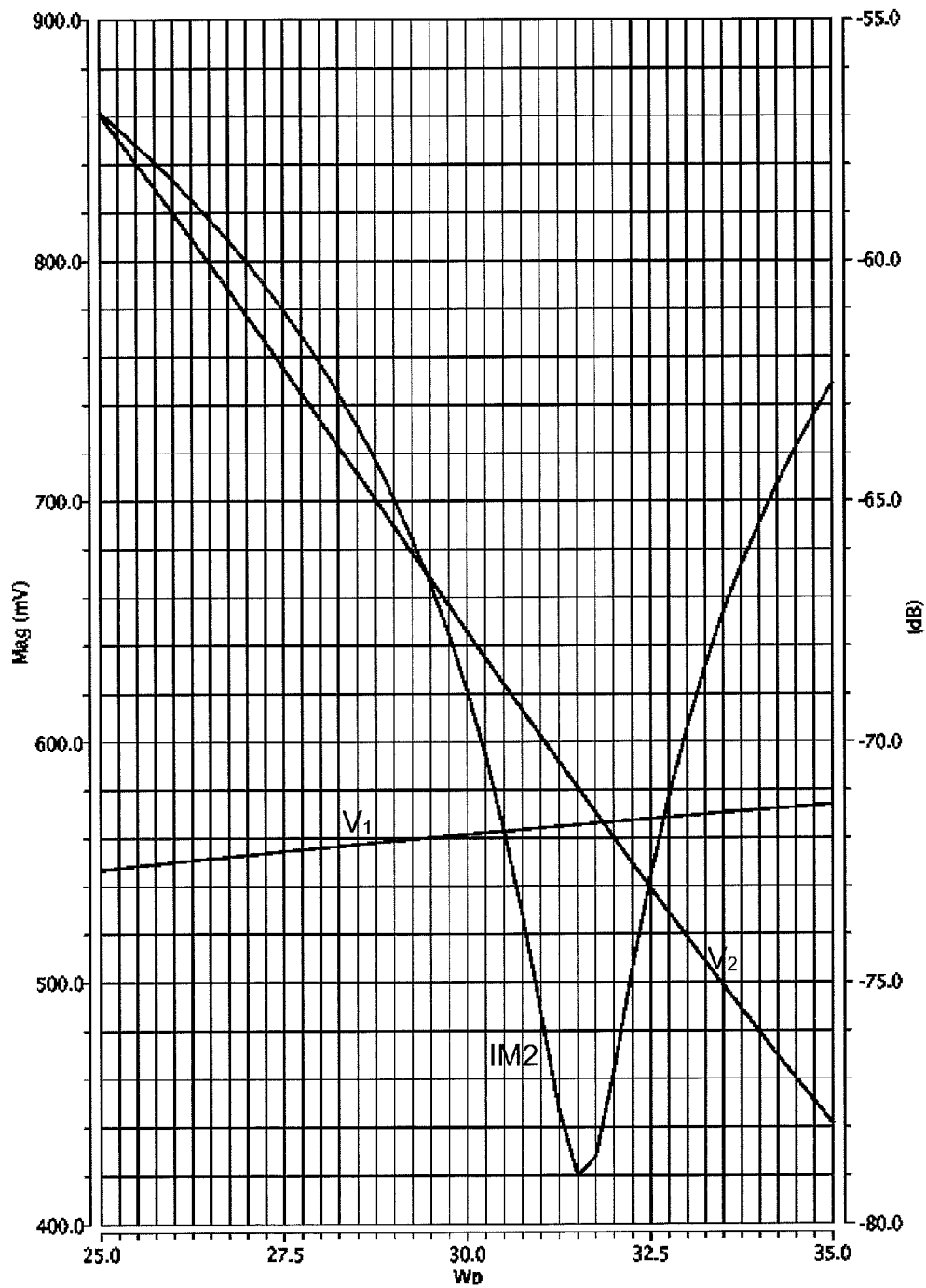
Figure 13:
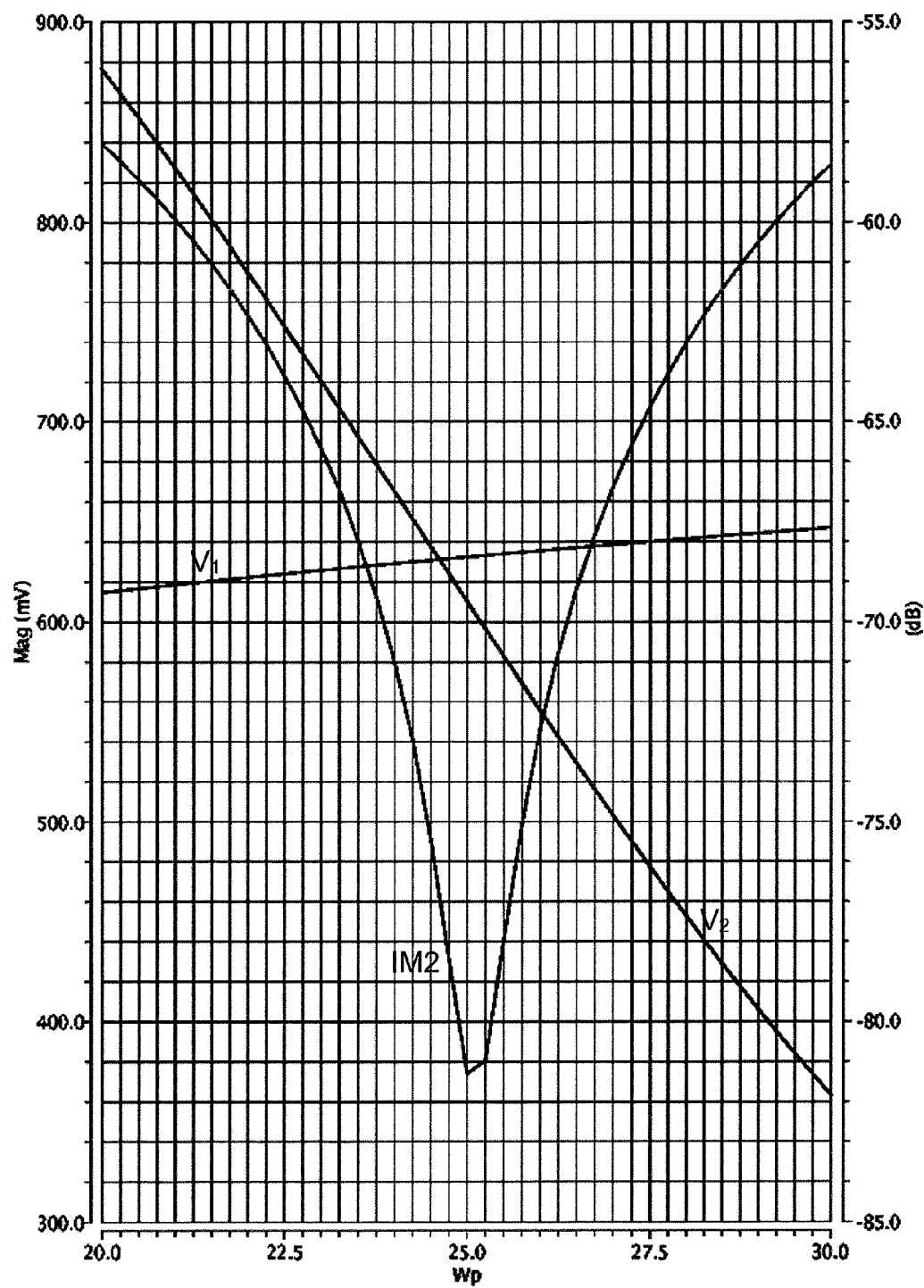

The results of the simulations are shown in FIGS. 11 to 13 for different process corners as functions of the PMOS width. FIG. 11 shows the simulation results for the typical-typical process corner, i.e. where both PMOS and NMOS are typical, FIG. 12 shows the simulation results for the fast-slow process corner, i.e. where the PMOS is slow and the NMOS is fast, and FIG. 13 shows the simulation results for the slow-fast process corner, i.e. where the PMOS is fast and the NMOS is slow.

For all three figures, the two lines labelled $V_1$ and $V_2$ are the two input voltages of the comparator in the detector circuit, to be read out on the left axis. Where the lines cross, the detected PMOS to NMOS size ratio is found. In the typical-typical case shown in FIG. 11 the found size ratio is equal to 2.8, because the horizontal axis reads 28 um PMOS width at the crossing, and the NMOS width is 10 um, giving a ratio of 2.8. Similarly, in the fast-slow case shown in FIG. 12 the found size ratio is equal to 3.18, and in the slow-fast case shown in FIG. 13 the found size ratio is equal to 2.46.

The second order intermodulation for the stand-alone amplifier is shown versus PMOS width as the curve labelled IM2 in the three figures, to be read out on the right axis. As can be seen the minimum second order intermodulation occurs near the detected PMOS to NMOS ratio for all process corners, yielding the technique effective.

It can also be seen that different process corners require quite different transistor width ratios (2.46 in slow-fast corner vs. 3.18 in fast-slow) showing the need for a calibration technique like this. If a fixed size ratio had been set during the design phase, the second order intermodulation would be quite considerable in some process corners, as it can be seen from these figures.

Thus by using the detection circuit described above, the proper ratio between NMOS and PMOS width can be determined so that low second order distortion in single-ended push-pull circuits is achieved over process variations.

Figure 14:
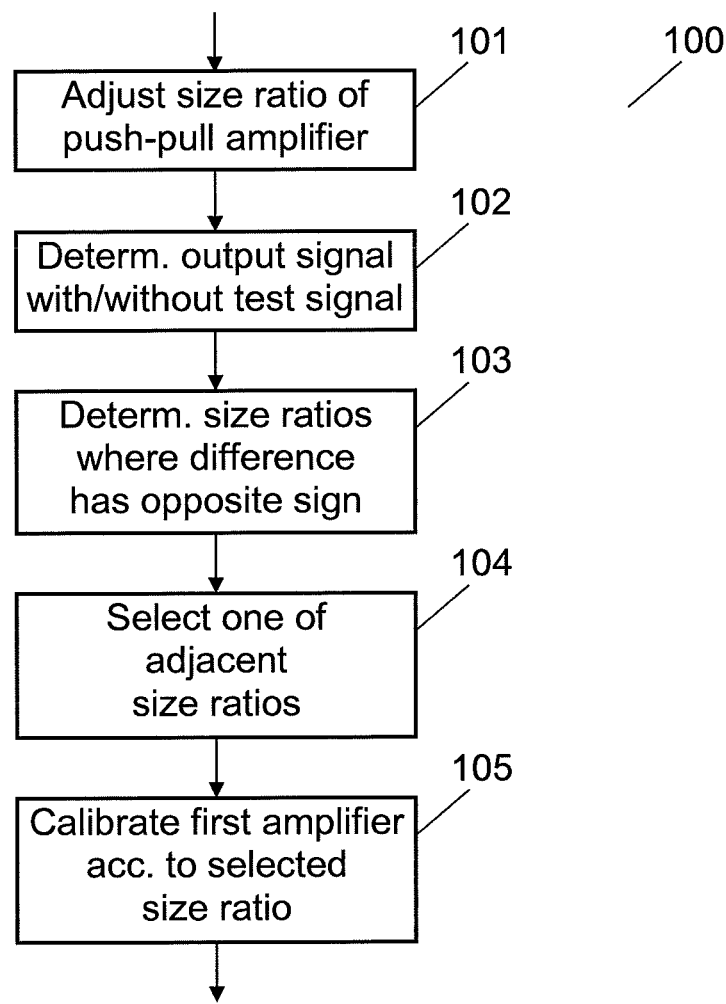
FIG. 14 shows a flow chart of a method of calibrating an amplifier circuit with a push-pull amplifier to achieve a low second order distortion.

FIG. 14 shows a flow chart illustrating a method of calibrating an amplifier circuit with a push-pull amplifier arranged in a signal path as the one described above to achieve a low second order distortion in the amplifier circuit.

In step 101, the size ratio between effective sizes of a complementary pair of transistor devices in a push-pull amplifier of a detection circuit is consecutively adjusted to a plurality of values. For each value of the size ratio, two push-pull amplifier output signals, i.e. one with and one without a test signal applied to the corresponding amplifier input, are detected in step 102. In step 103, the size ratio is determined, for which the difference between the two push-pull amplifier output signals is minimal, and the push-pull amplifier arranged in the signal path is then calibrated in dependence of this determined size ratio in step 104.

In other words, there is disclosed an electronic integrated circuit 55 comprising a first amplifier circuit with at least one push-pull amplifier 11 having a complementary pair of transistor devices 12, 13 arranged in series between two supply voltages, wherein the first amplifier circuit is configured to be calibrated to achieve a low second order distortion. The object is achieved when the integrated circuit further comprises a second amplifier circuit 15; 31; 32 with at least one push-pull amplifier 20, 21 having a complementary pair of transistor devices 22, 23, 24, 25 arranged in series between said supply voltages, wherein a size ratio between effective sizes of said complementary pair of transistor devices 22, 23, 24, 25 of the at least one push-pull amplifier 20, 21 of the second amplifier circuit is adjustable by adjusting the effective size of at least one of its transistor devices; and a test signal $LO_{in}$ can be applied on an input terminal of said second amplifier circuit; and that the electronic integrated circuit is configured to consecutively adjust the size ratio of the at least one push-pull amplifier 20, 21 of the second amplifier circuit to a plurality of values, determine for each size ratio two output signals of said second amplifier circuit, of which a first output signal $V_1$ is a low pass filtered output signal of a push-pull amplifier with applied test signal, and a second output signal $V_2$ is an output signal of a push-pull amplifier without applied test signal; determine two adjacent size ratios for which a difference between said first and second push-pull amplifier output signals $V_1$, $V_2$ has opposite sign; select one of said two adjacent size ratios; and calibrate the at least one push-pull amplifier 11 of the first amplifier circuit in dependence of said selected size ratio.

With the use of a second amplifier circuit in the form of a detection circuit having a push-pull amplifier with adjustable size ratio between its transistor devices and the possibility of determining the output of this push-pull amplifier with as well as without a test signal applied to its input, an optimal size ratio where the difference between the output with and without test signal, and thus also the second order distortion, is minimal can easily be found. The knowledge of this optimal size ratio can then be used for calibrating the push-pull amplifier of the first amplifier circuit, which is usually used in a signal path. In this way, second order distortion can be minimized even over process variations for the integrated circuit, since each integrated circuit is calibrated separately. The detection circuit is simple and has a low power consumption, and it can even be turned off after calibration, so that it does not consume any more energy.

The integrated circuit may further comprise a comparator 29 configured to compare said first and second push-pull amplifier output signals $V_1$, $V_2$ and to provide a comparator output signal indicative of a sign of the difference between said first and second push-pull amplifier output signals $V_1$, $V_2$; and the integrated circuit is further configured to determine the two adjacent size ratios for which a difference between said first and second push-pull amplifier output signals $V_1$, $V_2$ has opposite sign by determining a change in said comparator output signal. This use of a comparator to compare the two amplifier outputs is a simple way of detecting the optimal size ratio.

The second amplifier circuit may comprise two push-pull amplifiers of which a first push-pull amplifier 20 has an input connected to the input terminal of said second amplifier circuit on which a test signal $LO_{in}$ can be applied, and a second push-pull amplifier 21 has an input connected to the output of the first push-pull amplifier 20. The size ratios of the first and second push-pull amplifiers 20, 21 are then arranged to be adjusted to identical values; and the two output signals $V_1$, $V_2$ to be determined are the output signals of the first and second push-pull amplifiers. This is a simple implementation that allows the two output signals to be determined simultaneously. It is noted that in practice, it can be difficult to obtain exactly identical values due to manufacturing inaccuracies. Thus, in this context, identical means identical within manufacturing tolerances rather than exactly identical.

In that case, the second amplifier circuit may further be configured to replace the complementary pair of transistor devices of the first push-pull amplifier 20 with those of the second push-pull amplifier 21 and vice versa. In this way random offset in the amplifiers due to device mismatch can be mitigated.

In one embodiment, the complementary pair of transistor devices of the push-pull amplifiers of the first and second amplifier circuits are n-type and p-type field effect transistor devices, respectively.

In another embodiment, each transistor device 35 having an adjustable effective size can be implemented as a bank of transistors 41, 42, 43, wherein a selectable number of individual transistors can be coupled in parallel by means of controllable switches 44, 45, 46, 47, 48, 49. In that case, said controllable switches are implemented as field effect transistors 44, 45, 51.

In a further embodiment, the electronic integrated circuit is configured to apply said test signal $LO_{in}$ as a continuous wave signal from a local oscillator circuit 5 arranged on the electronic integrated circuit. This is a simple solution, since the local oscillator circuit is already present on the integrated circuit.

In a further embodiment, a size ratio of the at least one push-pull amplifier 11 of the first amplifier circuit is adjustable in the same way as for the at least one push-pull amplifier 20, 21 of the second amplifier circuit, and wherein the first amplifier circuit is calibrated by adjusting the size ratio of the at least one push-pull amplifier 11 of the first amplifier circuit to said selected size ratio. When the size ratio of the push-pull amplifier of the first amplifier circuit, i.e. the signal path amplifier circuit, is also adjustable, the determined size ratio can be used directly by this amplifier.

An electronic apparatus may comprise at least one electronic integrated circuit 55 as described above. In this way the apparatus benefits from the described advantages of the electronic integrated circuit. The electronic apparatus may be a wireless communications device comprising a direct conversion receiver or a low intermediate frequency receiver for radio frequency signals. In one embodiment, the wireless communications device may be a base station 61 for a wireless communications system. In another embodiment, the wireless communications device is a mobile phone 62 for use in a wireless communications system.

As mentioned, the invention further relates to a method of calibrating a first amplifier circuit of an electronic integrated circuit to achieve a low second order distortion, wherein the first amplifier circuit comprises at least one push-pull amplifier 11 having a complementary pair of transistor devices 12, 13 arranged in series between two supply voltages, wherein the electronic integrated circuit further comprises a second amplifier circuit 15; 31; 32 with at least one push-pull amplifier 20, 21 having a complementary pair of transistor devices 22, 23, 24, 25 arranged in series between said supply voltages, and wherein a size ratio between effective sizes of said complementary pair of transistor devices 22, 23, 24, 25 of the at least one push-pull amplifier 20, 21 of the second amplifier circuit is adjustable by adjusting the effective size of at least one of its transistor devices. The method comprises the steps of consecutively adjusting 101 the size ratio of the at least one push-pull amplifier 20, 21 of the second amplifier circuit to a plurality of values; determining 102, for each size ratio, two output signals of said second amplifier circuit, of which a first output signal $V_1$ is a low pass filtered output signal of a push-pull amplifier with a test signal applied to an input terminal of said second amplifier circuit, and a second output signal $V_2$ is an output signal of a push-pull amplifier without applied test signal; determining 103 two adjacent size ratios for which a difference between said first and second push-pull amplifier output signals $V_1$, $V_2$ has opposite sign; selecting one of said adjacent size ratios; and calibrating 104 the at least one push-pull amplifier 11 of the first amplifier circuit in dependence of said selected size ratio.

With the use of a second amplifier circuit in the form of a detection circuit having a push-pull amplifier with adjustable size ratio between its transistor devices and the possibility of determining the output of this push-pull amplifier with as well as without a test signal applied to its input, an optimal size ratio where the difference between the output with and without test signal, and thus also the second order distortion, is minimal can easily be found. The knowledge of this optimal size ratio can then be used for calibrating the push-pull amplifier of the first amplifier circuit, which is usually used in a signal path. In this way, second order distortion can be minimized even over process variations for the integrated circuit, since each integrated circuit is calibrated separately. The detection circuit is simple and has a low power consumption, and it can even be turned off after calibration, so that it does not consume any more energy.

In one embodiment, the method comprises the step of applying said test signal $LO_{in}$ as a continuous wave signal from a local oscillator circuit 5 arranged on the electronic integrated circuit. This is a simple solution, since the local oscillator circuit is already present on the integrated circuit.

In another embodiment, a size ratio of the at least one push-pull amplifier 11 of the first amplifier circuit is adjustable in the same way as for the at least one push-pull amplifier 20, 21 of the second amplifier circuit, and the method comprises the step of calibrating the first amplifier circuit by adjusting the size ratio of the at least one push-pull amplifier 11 of the first amplifier circuit to said selected size ratio. When the size ratio of the push-pull amplifier of the first amplifier circuit, i.e. the signal path amplifier circuit, is also adjustable, the determined size ratio can be used directly by this amplifier.

Although various embodiments of the present invention have been described and shown, the invention is not restricted thereto, but may also be embodied in other ways within the scope of the subject-matter defined in the following claims.

The invention claimed is:

1. An electronic integrated circuit comprising:
a first amplifier circuit with at least one push-pull amplifier having a complementary pair of transistor devices arranged in series between two supply voltages, wherein the first amplifier circuit is configured to be calibrated to achieve a low second order distortion,
wherein the integrated circuit further comprises a second amplifier circuit with at least one push-pull amplifier having a complementary pair of transistor devices arranged in series between said supply voltages,
wherein a size ratio between effective sizes of said complementary pair of transistor devices of the at least one push-pull amplifier of the second amplifier circuit is adjustable by adjusting the effective size of at least one of its transistor devices; and
a test signal can be applied on an input terminal of the second amplifier circuit; and wherein the electronic integrated circuit is configured to:
consecutively adjust the size ratio of the at least one push-pull amplifier of the second amplifier circuit to a plurality of values,
determine for each size ratio a first output signal that is a low pass filtered output signal of at least one of the at least one push-pull amplifier of the second amplifier circuit having an input to which the test signal is applied, and a second output signal that is an output signal of a same or a different one of the at least one push-pull amplifier of the second amplifier circuit without the test signal being applied at an input terminal of the same or the different one of the at least one push-pull amplifier;
determine two adjacent size ratios for which a difference between the first and second output signals has opposite sign;
select one of said two adjacent size ratios; and
calibrate the at least one push-pull amplifier of the first amplifier circuit in dependence of said selected size ratio.

2. The electronic integrated circuit according to claim 1, wherein
the integrated circuit further comprises a comparator configured to compare said first and second output signals and to provide a comparator output signal indicative of a sign of the difference between said first and second output signals; and
the integrated circuit is further configured to determine the two adjacent size ratios for which a difference between said first and second push-pull amplifier output signals has opposite sign by determining a change in said comparator output signal.

3. The electronic integrated circuit according to claim 1, wherein:
the second amplifier circuit comprises two push-pull amplifiers of which a first push-pull amplifier has an input connected to the input terminal of the second amplifier circuit on which a test signal can be applied, and a second push-pull amplifier has an input connected to the output of the first push-pull amplifier;
the two output signals to be determined are the output signals of the first and second push-pull amplifiers; and
the size ratios of the first and second push-pull amplifiers are arranged to be adjusted to identical values.

4. The electronic integrated circuit according to claim 3, wherein the second amplifier circuit is further configured to replace the complementary pair of transistor devices of the first push-pull amplifier with those of the second push-pull amplifier and vice versa.

5. The electronic integrated circuit according to claim 1, wherein the complementary pair of transistor devices of the push-pull amplifiers of the first and second amplifier circuits are n-type and p-type field effect transistor devices, respectively.

6. The electronic integrated circuit according to claim 1, wherein each transistor device having an adjustable effective size is implemented as a bank of transistors, wherein a selectable number of individual transistors can be coupled in parallel by means of controllable switches.

7. The electronic integrated circuit according to claim 6, wherein said controllable switches are implemented as field effect transistors.

8. The electronic integrated circuit according to claim 1, wherein the electronic integrated circuit is configured to apply said test signal as a continuous wave signal from a local oscillator circuit arranged on the electronic integrated circuit.

9. The electronic integrated circuit according to claim 1, wherein a size ratio of the at least one push-pull amplifier of the first amplifier circuit is adjustable in the same way as for the at least one push-pull amplifier of the second amplifier circuit, and wherein the first amplifier circuit is calibrated by adjusting the size ratio of the at least one push-pull amplifier of the first amplifier circuit to said selected size ratio.

10. An electronic apparatus comprising at least one electronic integrated circuit according to claim 1.

11. The electronic apparatus according to claim 10, wherein the electronic apparatus is a wireless communications device comprising a direct conversion receiver or a low intermediate frequency receiver for radio frequency signals.

12. The electronic apparatus according to claim 11, wherein the wireless communications device is a base station for a wireless communications system.

13. The electronic apparatus according to claim 11, wherein the wireless communications device is a mobile phone for use in a wireless communications system.

14. A method of calibrating a first amplifier circuit of an electronic integrated circuit to achieve a low second order distortion, wherein the first amplifier circuit comprises at least one push-pull amplifier having a complementary pair of transistor devices arranged in series between two supply voltages, wherein the electronic integrated circuit further comprises a second amplifier circuit with at least one push-pull amplifier having a complementary pair of transistor devices arranged in series between said supply voltages, and wherein a size ratio between effective sizes of said complementary pair of transistor devices of the at least one push-pull amplifier of the second amplifier circuit is adjustable by adjusting the effective size of at least one of its transistor devices;

the method comprising the steps of:
- consecutively adjusting the size ratio of the at least one push-pull amplifier of the second amplifier circuit to a plurality of values;
- determining, for each size ratio, a first output signal that is a low pass filtered output signal of at least one of the at least one push-pull amplifier of the second amplifier circuit when a test signal is applied to an input terminal of the at least one of the at least one push-pull amplifier of the second amplifier circuit, and a second output signal that is an output signal of a same or a different one of the at least one push-pull amplifier of the second amplifier circuit without the test signal being applied at an input terminal of the same or the different one of the at least one push-pull amplifier of the second amplifier circuit;
- determining two adjacent size ratios for which a difference between the first and second output signals has opposite sign;
- selecting one of said adjacent size ratios; and
- calibrating the at least one push-pull amplifier of the first amplifier circuit in dependence of said selected size ratio.

15. The method according to claim 14, wherein the method comprises the step of applying said test signal as a continuous wave signal from a local oscillator circuit arranged on the electronic integrated circuit.

16. The method according to claim 14, wherein a size ratio of the at least one push-pull amplifier of the first amplifier circuit is adjustable in the same way as for the at least one push-pull amplifier of the second amplifier circuit, and wherein the method comprises the step of calibrating the first amplifier circuit by adjusting the size ratio of the at least one push-pull amplifier of the first amplifier circuit to said selected size ratio.

* * * * *